United States Patent
Greenspan et al.

(10) Patent No.: US 10,311,171 B2
(45) Date of Patent: Jun. 4, 2019

(54) MULTI-COMPONENT AND MIXED-REALITY SIMULATION ENVIRONMENTS

(71) Applicants: Steven L. Greenspan, Scotch Plains, NJ (US); Debra J. Danielson, Skillman, NJ (US); James D. Reno, Scotts Valley, CA (US); John P. Kane, Tafton, PA (US); Prashant Parikh, Holtsville, NY (US)

(72) Inventors: Steven L. Greenspan, Scotch Plains, NJ (US); Debra J. Danielson, Skillman, NJ (US); James D. Reno, Scotts Valley, CA (US); John P. Kane, Tafton, PA (US); Prashant Parikh, Holtsville, NY (US)

(73) Assignee: CA, Inc., New York, NY (US)

( * ) Notice: Subject to any disclaimer, the term of this patent is extended or adjusted under 35 U.S.C. 154(b) by 583 days.

(21) Appl. No.: 14/636,134

(22) Filed: Mar. 2, 2015

(65) Prior Publication Data

US 2016/0259870 A1    Sep. 8, 2016

(51) Int. Cl.
*H04W 4/70* (2018.01)
*G06F 17/50* (2006.01)

(52) U.S. Cl.
CPC .......... *G06F 17/5009* (2013.01); *H04W 4/70* (2018.02)

(58) Field of Classification Search
CPC .......... G05B 2219/39014; G05B 2219/40131; H04L 41/0806; H04L 41/0883;

(Continued)

(56) References Cited

U.S. PATENT DOCUMENTS

| 6,421,048 B1 * | 7/2002 | Shih | ...... G06F 3/016 |
| | | | 345/419 |
| 7,042,440 B2 * | 5/2006 | Pryor | ...... A63F 13/02 |
| | | | 345/158 |

(Continued)

OTHER PUBLICATIONS

Winn, J. "Integration of Massive Multiplayer Online Role-Playing Games Client-Server Architecture with Collaborative Multi-User Engineering CAx Tools" (2012). All Theses and Dissertations. 6209: Brigham Young University [retrieved on Jun. 8, 2018]. Retrieved from <https://scholarsarchive.byu.edu/etd/6209>.*

(Continued)

*Primary Examiner* — Aniss Chad
*Assistant Examiner* — Alfred H B Wechselberger
(74) *Attorney, Agent, or Firm* — Baker Botts L.L.P.

(57) ABSTRACT

Systems and methods may include receiving real-time data about a real component operating in a real-world environment. The systems and methods may further include generating a virtual representation of the real component based on the real-time data about the real component and historical data associated with the real component. In addition, the systems and methods may include receiving injected data from a lab. The injected data may provide data about a lab component operating in the lab. The systems and methods may also include simulating, in a virtual environment, a real-time interaction in the real-world environment between the real component and the lab component using the virtual representation of the real component and the injected data. Moreover, the systems and methods may include determining a real-time performance characteristic of at least one of the lab component and the real component based on the simulated real-time interaction in the real-world environment.

20 Claims, 5 Drawing Sheets

(58) Field of Classification Search
CPC ... H04L 67/10; G06F 8/30; G06F 8/34; G06F 3/0346; B25J 9/1689; G05G 5/03; Y10S 901/46
See application file for complete search history.

(56) References Cited

U.S. PATENT DOCUMENTS

| | | | | |
|---|---|---|---|---|
| 8,068,983 | B2* | 11/2011 | Vian | G09B 9/003 701/1 |
| 8,088,004 | B2* | 1/2012 | Freeman | A63F 13/00 250/332 |
| 8,380,362 | B2* | 2/2013 | Beavin | G05D 1/0044 342/450 |
| 8,405,680 | B1* | 3/2013 | Cardoso Lopes | G06T 19/00 345/426 |
| 8,935,779 | B2 | 1/2015 | Manni et al. | |
| 9,015,020 | B2* | 4/2015 | Lontka | G05B 15/02 703/13 |
| 2003/0030397 | A1* | 2/2003 | Simmons | B25J 9/0006 318/568.11 |
| 2004/0219491 | A1* | 11/2004 | Shlomo | F41G 3/265 434/11 |
| 2007/0079308 | A1* | 4/2007 | Chiaramonte | G06F 9/5077 718/1 |
| 2009/0259321 | A1* | 10/2009 | Stellari | G05B 15/02 700/9 |
| 2010/0073363 | A1* | 3/2010 | Densham | G05B 17/02 345/419 |
| 2010/0103196 | A1* | 4/2010 | Kumar | G06F 3/012 345/633 |
| 2010/0279255 | A1* | 11/2010 | Williams, II | G09B 9/14 434/29 |
| 2011/0060569 | A1* | 3/2011 | Lynn | G06F 11/0739 703/6 |
| 2011/0254704 | A1 | 10/2011 | Fournier et al. | |
| 2012/0053925 | A1 | 3/2012 | Geffin et al. | |
| 2012/0113140 | A1* | 5/2012 | Hilliges | G06F 3/011 345/633 |
| 2012/0144236 | A1* | 6/2012 | Black | H04L 41/145 714/25 |
| 2013/0328927 | A1* | 12/2013 | Mount | G06T 19/006 345/633 |
| 2014/0193154 | A1 | 7/2014 | Graham et al. | |
| 2014/0221090 | A1* | 8/2014 | Mutschler | G06F 3/011 463/31 |
| 2014/0344622 | A1 | 11/2014 | Huang et al. | |
| 2015/0095485 | A1 | 4/2015 | Alatorre et al. | |
| 2015/0106316 | A1 | 4/2015 | Birdwell et al. | |
| 2015/0355957 | A1 | 12/2015 | Steiner et al. | |
| 2016/0180590 | A1* | 6/2016 | Kamhi | G06K 9/00671 345/633 |

OTHER PUBLICATIONS

Hoyer et al. "A Multiuser Virtual-Reality Environment fora Tele-Operated Laboratory" IEEE Transactions on Education, vol. 47, No. 1 [retrieved on Jan. 4, 2019]. Retrieved from <http://www.dr-bischoff.de/research/pdf/Hoyer04a_01266759_veroeffentlichte_version.pdf> (Year: 2004).*

Back et al. "The Virtual Chocolate Factory: Building a Real World Mixed-Reality System for Industrial Collaboration and Control" 2010 IEEE Interntl Conf. on Multimedia and Expo; doi: 10.1109/ICME.2010.5582532 [retrieved on Jan. 4, 2019]. Retrieved from <https://ieeexplore.ieee.org/document/5582532> (Year: 2010).*

United States Patent and Trademark Office, Non-Final Office Action issued in U.S. Appl. No. 14/636,136, dated Sep. 1, 2016.

United States Patent and Trademark Office, Notice of Allowance issued in U.S. Appl. No. 14/636,136, dated Jan. 17, 2017.

* cited by examiner

2

MULTI-COMPONENT AND MIXED-REALITY SIMULATION ENVIRONMENTS

BACKGROUND

The present disclosure relates to infrastructure management and, more specifically, to systems and methods for multi-component and mixed-reality simulation environments.

As the so-called Internet of Things expands, an increasing number of smart devices have been developed to interconnect within the existing Internet infrastructure. Such devices may be used to collect information and to automate a growing number of important tasks in a variety of fields.

BRIEF SUMMARY

According to an aspect of the present disclosure, a method may include several processes. In particular, the method may include receiving real-time data about a real component operating in a real-world environment. The method may further include generating a virtual representation of the real component based on the real-time data about the real component and historical data associated with the real component. In addition, the method may include receiving injected data from a lab. The injected data may provide data about a lab component operating in the lab. The method may also include simulating, in a virtual environment, a real-time interaction in the real-world environment between the real component and the lab component using the virtual representation of the real component and the injected data. Moreover, the method may include determining a real-time performance characteristic of at least one of the lab component and the real component based on the simulated real-time interaction in the real-world environment.

Other objects, features, and advantages will be apparent to persons of ordinary skill in the art from the following detailed description and the accompanying drawings.

BRIEF DESCRIPTION OF THE DRAWINGS

Aspects of the present disclosure are illustrated by way of example and are not limited by the accompanying figures with like references indicating like elements.

DETAILED DESCRIPTION

Figure 1:
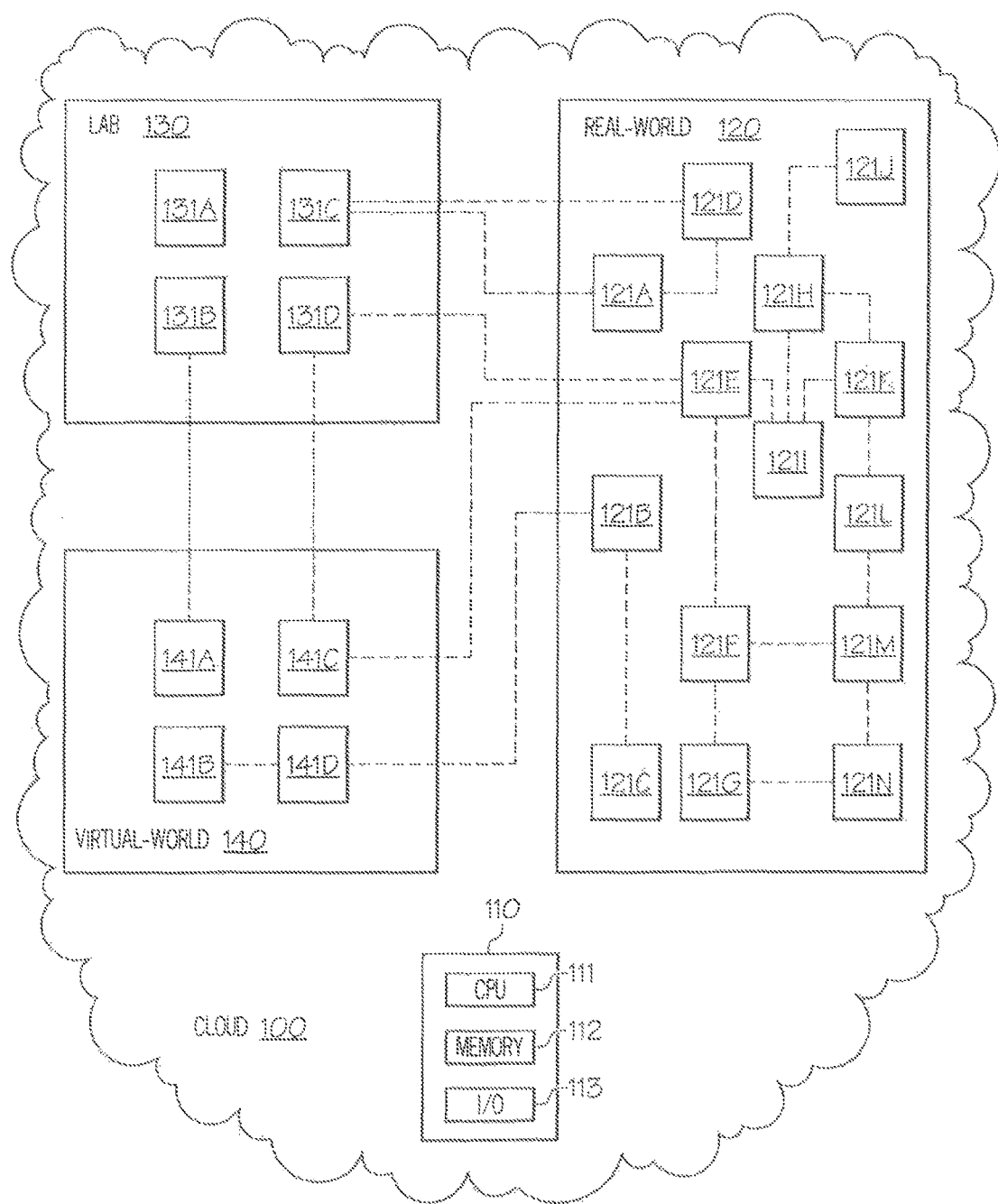
FIG. 1 is a schematic representation of a cloud network 100 on which systems and methods for multi-component and mixed-reality simulation environments may be implemented.

As will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely in hardware, entirely in software (including firmware, resident software, micro-code, etc.) or in a combined software and hardware implementation that may all generally be referred to herein as a "circuit," "module," "component," or "system." Furthermore, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would comprise the following: a portable computer diskette, a hard disk, a random access memory ("RAM"), a read-only memory ("ROM"), an erasable programmable read-only memory ("EPROM" or Flash memory), an appropriate optical fiber with a repeater, a portable compact disc read-only memory ("CD-ROM"), an optical storage device, a magnetic storage device, or any suitable combination of the foregoing. In the context of this document, a computer readable storage medium may be any tangible medium able to contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take a variety of forms comprising, but not limited to, electro-magnetic, optical, or a suitable combination thereof. A computer readable signal medium may be a computer readable medium that is not a computer readable storage medium and that is able to communicate, propagate, or transport a program for use by or in connection with an instruction execution system, apparatus, or device. Program code embodied on a computer readable signal medium may be transmitted using an appropriate medium, comprising but not limited to wireless, wireline, optical fiber cable, RF, etc., or any suitable combination of the foregoing.

Computer program code for carrying out operations for aspects of the present disclosure may be written in a combination of one or more programming languages, comprising an object oriented programming language such as JAVA®, SCALA®, SMALLTALK®, EIFFEL®, JADE®, EMERALD®, C++, C#, VB.NET, PYTHON® or the like, conventional procedural programming languages, such as the "C" programming language, VISUAL BASIC®, FORTRAN® 2003, Perl, COBOL 2002, PHP, ABAP®, dynamic programming languages such as PYTHON®, RUBY® and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider) or in a cloud computing environment or offered as a service such as a Software as a Service ("SaaS").

Aspects of the present disclosure are described herein with reference to flowchart illustrations and/or block diagrams of methods, apparatuses (e.g., systems), and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that, when executed, may direct a computer, other programmable data processing apparatus, or other devices to function in a particular manner, such that the instructions, when stored in the computer readable medium, produce an article of manufacture comprising instructions which, when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses, or other devices to produce a computer implemented process, such that the instructions which execute on the computer or other programmable apparatus provide processes for implementing the functions/acts specified in the flowchart and/or block diagram block or blocks.

While certain example systems and methods disclosed herein may be described with reference to infrastructure management and, more specifically, to multi-component and mixed-reality simulation environments, as related to managing and deploying resources in an IoT infrastructure, systems and methods disclosed herein may be related to other areas beyond the IoT and may be related to aspects of IoT other than the example implementations described herein. Systems and methods disclosed herein may be applicable to a broad range of applications that require access to networked resources and infrastructure and that are associated with various disciplines, such as, for example, research activities (e.g., research and design, development, collaboration), commercial activities (e.g., sales, advertising, financial evaluation and modeling, inventory control, asset logistics and scheduling), IT systems (e.g., computing systems, cloud computing, network access, security, service provisioning), and other activities of importance to a user or organization.

As described below in more detail, aspects of this disclosure may be described with respect to particular example implementations. For example, this disclosure often refers to the example of one or more convoys of trucks operating in one or more geographic locations for one or more organizations. Nevertheless, such example implementations are not limiting examples, but rather are provided for the purposes of explanation. Accordingly, the concepts set forth in this disclosure may be applied readily to a variety of fields and industries and should not be limited to merely the example implementations described herein.

The recent explosion of network-enabled components has presented the opportunity to monitor and study systems over a range of levels. In particular, numerous connected sensors and components are now available and may be incorporated into a variety of systems to enable the real-time monitoring of the system as a whole and the system's components on a discrete level. Such connectivity, however, also opens the door for malicious actors to improperly obtain data from these network-enabled sensors and components or even to hijack such sensors and components for their own malicious purposes. Consequently, it may be desirable to implement processes for real-time identification of compromised, malfunctioning, and/or underperforming components in the field and to provide immediate corrective measures, such as replacement, without interrupting the performance of systems utilizing such components. Certain systems and methods disclosed herein may permit such corrective measures to be made remotely by utilizing virtual components and/or laboratory components operating in controlled environments, for example.

Particular implementations disclosed herein may permit administrators to implement real-time performance monitoring, testing, and evaluation of components deployed in the actual system (e.g., the field, the real-world), components deployed in a laboratory environment (e.g., the lab), and virtual components generated by a computer model and simulated (e.g., the virtual-world) as these components interact with one another. In certain implementations, such processes may provide means to discover anomalies in the data received from network-enabled components and anomalies in the network-enabled components themselves. In some implementations, such processes may provide means to suggest component upgrades, to automatically upgrade components, or to repair or replace malfunctioning or otherwise anomalous components. Moreover, by utilizing network connectivity, components operating in the field may be temporarily (or permanently) replaced by components operating in the lab or in the virtual-world in real-time, such that systems in the field may be maintained in an operational state and/or upgraded on-the-fly without requiring substantial downtime.

Referring now to FIG. 1, a cloud network 100 on which systems and methods on which multi-component and mixed-reality simulation environments may be implemented now is disclosed. Systems and methods for intelligent infrastructure management may be implemented on cloud network 100. Cloud Network 100 may comprise one or more cloud-based network, which may be public clouds, private clouds, or community clouds. Each cloud may permit the exchange of information, services, and other resources between various components that are connected to such clouds. In certain configurations, cloud network 100 may be a wide area network, such as the Internet, or may connect with a wide-area network. In some configurations, cloud network 100 may be a local area network, such as an intranet. Further, cloud network 100 may be a closed, private network in certain configurations, and cloud network 100 may be an open network in other configurations. Cloud network 100 may facilitate wired or wireless communications between components therein and may permit components therein to access various resources of cloud network 100. In certain configurations, cloud network 100 may implement one or more combinations of the features disclosed above.

Cloud network 100 may comprise one or more servers that may store resources thereon, host resources thereon, or otherwise make resources available. Such resources may comprise, but are not limited to, information technology services, financial services, business services, access services, other resource-provisioning services, secured files and information, unsecured files and information, accounts, and other resources desired by one or more entities. More generally, such servers may comprise, for example, one or more of general purpose computing devices, specialized computing devices, mainframe devices, wired devices, wireless devices, and other devices configured to provide, store, utilize, monitor, or accumulate resources and the like.

Cloud Network 100 also may comprise one or more devices utilized by one or more consumers of provided services. The one or more service providers may provide services to the one or more consumers utilizing the one or more servers, which connect to the one or more devices via cloud network 100. The services may comprise, for example, information technology services, financial services, business services, access services, and other resource-provisioning services. The devices may comprise, for example, one or more of general purpose computing devices, specialized computing devices, mobile devices, wired devices, wireless devices, passive devices, routers, switches, and other devices utilized by consumers of provided services.

Moreover, cloud network 100 may comprise one or more processing system 110 that may collect and process data received from one or more components within cloud network 100, as will be described in more detail below. In some configurations, processing system 110 may be a server, a consumer device, a combination of a server and a consumer device, or any other device with the ability to collect and process data. Processing system 110 may include a single processor or a plurality of processors. In some configurations, processing system 110 may be implemented by an integrated device. In other configurations, processing system 110 may be implemented by a plurality of distributed systems residing in one or more geographic regions.

In particular configurations, cloud network 100 may include a plurality of devices, such as real devices 121A-N, lab devices 131A-D, and virtual devices 141A-D, for example. Real devices 121A-N may be physical devices disposed at one or more locations in a real-world environment 120 (e.g., the field). Real-world environment 120 may subject real devices 121A-N to the unpredictability of the real-world and various environmental interactions. Lab devices 131A-D may be physical devices disposed at one or more locations in a laboratory environment 130 (e.g., the lab). Laboratory environment 130 may subject lab devices 131A-D to controlled interactions in the lab that may be tailored to perform certain tests or evaluations and, in some configurations, may be highly predictable. In some configurations, one or more of lab devices 131A-D may be a virtual device simulated by a processing system in laboratory environment 130, for example. Virtual devices 141A-D may be virtual devices generated in a virtual-world environment 140 (e.g., the virtual space) by a processing system, such as processing system 110, for example.

Real devices 121A-N may be one or more of a variety of devices, such as servers, consumer devices, components of a system (e.g., lights, speakers, brakes, processors, instrumentation, servos, motors, cooling systems, heating systems, pumps, emissions systems, power systems), sensors (e.g., pressure sensors, temperature sensors, airflow sensors, velocity sensors, acceleration sensors, composition sensors, electrical sensors, position sensors), and combinations thereof, for example. More generally, real devices 121A-N may be part of one or more systems deployed in real-world environment 120. Each of real devices 121A-N may include an input/output ("I/O") device, such that each of real devices 121A-N may transmit and receive information over network 100 to one or more of lab devices 131A-D, virtual devices 141A-D, processing system 110, and others of real devices 121A-N. Such transmitted information may include performance data (e.g., telemetry data) related to the device (e.g., position of the device, temperature near the device, air pressure near the device, environmental composition near the device, information indicating whether the device is functioning, log information identifying sources and/or recipients of information received and/or sent by the device and/or the nature of such information, information about components being monitored by the device, status information, other parameters), requests for information from other devices, and commands for other devices to perform particular functions. Real devices 121A-N may receive similar information from other devices. In some configurations, one or more of real devices 121A-N may aggregate and process the received information and generate new information therefrom, such as summary information, forecast information, and other useful information for transmission to other devices, for example.

Similar to real devices 121A-N, lab devices 131A-D may be one or more of a variety of devices, such as servers, consumer devices, components of a system, sensors, and combinations thereof, for example. In contrast to real devices 121A-N, lab devices 131A-D may be part of one or more systems deployed in lab environment 130, where environmental conditions and interactions may be highly controlled. In some configurations, lab devices 131A-D may be similar to (or even identical to) one or more of real devices 121A-N. In other configurations, lab devices 131A-D may be modified versions of one or more of real devices 121A-N. In still other configurations, lab devices 131A-D may be new or experimental devices, which are different from real devices 121A-N. Such lab devices 131A-D may be integrated into network 100 for testing or evaluation purposes to study their interactions with real devices 121A-N and virtual devices 141A-D.

Virtual devices 141A-D may represent one or more of real devices 121A-N, lab devices 131A-D, and other devices, such as new devices, prototype devices, theoretical devices (e.g., virtual models of devices, conceptual devices that have not been physically constructed). A processing system, such as processing system 110 or another processing system, may collect performance data from one or more of real devices 121A-N, lab devices 131A-D, others of virtual devices 141A-D, and generate virtual models for one or more of virtual devices 141A-D. For example, virtual device 141C may be a virtual model of lab device 131D, virtual device 141D may be a virtual model of real device 121B, and virtual devices 141A and 141B may be virtual devices interacting with one or more real devices and lab devices.

In addition to the collected performance data, the processing system also may collect environmental data (e.g., temperature readings, air pressure readings, weather condition forecasts or readings, population or capacity forecasts or readings, electromagnetic readings) about the real-world environment 120 from other sources (e.g., data feeds, data repositories, other sensors and monitoring devices, other systems). Using the performance data and the environmental data, the processing system may simulate interactions between the virtual models of real devices 121A-N, the virtual models of lab devices 131A-D, one or more of virtual devices 141A-D, real-world environment 120, laboratory environment 130, and virtual environment 140.

The performance data and environmental data used to generate virtual models and simulations may include both historical data and real-time data, which may be used to dynamically update the virtual models in real time. Accordingly, the simulations may be used to predict future behavior of one or more of real devices 121A-N, lab devices 131A-D, and virtual devices 141A-D and provide warnings or proactive measures when useful.

In particular configurations, systems and methods disclosed herein may combine together the three domains of real-world environment 120, laboratory environment 130, and virtual environment 140 to create simulation, monitoring, and other possible activities.

The real-world environment 120 may provide telemetry data from one or more components in the field, such as real devices 121A-N. For example, one or more of real devices 121A-N may be components of a delivery truck. One or more of real devices 121A-N may transmit telemetry data, such as speed, location, temperature, pressure, status, and/or humidity, for example, to processing system 110 via network 100, for example.

The virtual environment 140 may allow for simulation of interactions between one or more virtual components, such as virtual devices 141A-D, for example. One or more of virtual devices 141A-D also may be actual components of the delivery truck or may represent actual components of the delivery truck.

The laboratory environment 130 may provide an environment for testing and evaluating components outside of the real-world environment 120. For example, laboratory environment 130 may include components, such as lab devices 131A-D, on a lab "bench" and connected to network 100, so that these components can inject events into the real-world environment 120 and the virtual environment 140 or simulate such events in such environments. One or more of lab devices 131A-D also may be actual components of the delivery truck or may represent actual components of the delivery truck. For example, one or more of lab devices 131A-D may be a duplicate of an actual component of the delivery truck, may perform functions of an actual component of the delivery truck, and/or may otherwise be a proxy for an actual component of the delivery truck.

For example, in laboratory environment 130, a mock-up of the delivery truck may be constructed with a camera configured to monitor the face of a mock driver. The facial expressions of the mock driver may then be used, instead of the facial expressions of an actual truck driver, to trigger events or responses in real-time by a virtual model (in virtual environment 140) of an actual truck being driven in real-world environment 120 by the actual truck driver that receives real-time performance data regarding the actual truck. In this manner, researchers may study how the simulation behaves in comparison to the actual data in field. Moreover, researchers may inject other kinds of events, anomalies, and so forth into the simulation to further study interactions in the virtual environment 140, the lab environment 130, and the real-world environment 120.

As another example, modified performance data for a component may be provided from the laboratory environment 130 or the virtual environment 140 to the real-world environment 120 (e.g., the modified performance data may be injected into the data stream). The altered performance data may indicate that a particular real-world device is broken, such that other real-world devices believe that the particular real-world device is broken. In other words, injecting the data indicating that the particular real-world device is broken creates a false positive event. The response of the system to the "broken" component may be recorded for further study or studied in real-time. In this manner, researchers may use the performance data related to the system's response to the "broken" component to create improved virtual models for the system and develop improved responses to actual broken components.

In some implementations, collection of performance data and simulations may be based on real-world components owned/operated by a plurality of customers that typically do not share performance data for competitive reasons. For example, a delivery truck may be owned and operated in the field by a parcel delivery company, a first new component for the delivery truck may be located in a lab owned by a first car manufacturer, and a second new component for the truck may be located in a lab owned by a second car manufacturer. The parcel delivery company may send performance data about the delivery truck to a central processing system, which may be operated by a third-party administrator. The first car manufacturer may send performance data about the first component to the central processing system, and the second car manufacturer may send performance data about the second component to the central processing system. Thus, each of the parcel delivery company, the first car manufacturer, and the second car manufacturer may operate effectively as black boxes that output performance data. The third-party administrator may create a virtual model of the truck using real-time performance data from the actual truck and run, in parallel, separate simulations for the truck using the first component and the second component. The third-party administrator may provide the first car manufacturer with the results of the simulation using the first component. Further, the third-party administrator may provide the second car manufacturer with the results of the simulation using the second component. Thus, both car manufacturers' components may be tested under identical conditions. Moreover, the third-party administrator may provide the parcel delivery service with a comparison of the results of the simulation using the first component and the second component, so that the parcel delivery service may determine which component to purchase. In certain implementations, one or more of the customers and/or the third-party administrator may establish privacy and/or security rules specifying what information may be shared. In such implementations, the third-party administrator may apply such privacy and/or security rules when sharing collected and/or processed information.

In another example, the parcel delivery service may have a plurality of trucks in its fleet. The components in those trucks may be smart components, which means that the components may monitor the trucks' environments or act upon the trucks in ways that are important to the integrity of the truck and communicate their status with other trucks, headquarters, or satellite control units through the cloud. Because the components are continuously communicating with one another, there is a risk that these components may be hacked into or that messages may be sent to these components that did not originate from the processing system or from other components in the system. Similarly, there is also a risk that that messages may appear to be sent from these components that did not originate from the components, which may cause the processing system or the other components to perform anomalous actions.

For example, a the tire pressure gauge, which is sending information about tire pressure for a tire on a truck to the processing system, may have been hacked into or the data feed for the truck's components may have been maliciously penetrated. The hack/penetration may result in the processing system receiving performance data indicating that the left tire now has no pressure (e.g., the pressure level is zero). Generally, this information alone would trigger a warning because a completely flat tire may be extremely hazardous. Nevertheless, particular configurations disclosed herein may avoid this untimely warning by using performance data from other components. In particular, the processing system may analyze the other performance data (e.g., weather conditions, road conditions, the truck's energy use, the truck's gas consumption, the driver's behavior, wheel camber, wheel pitch) and use this other performance data to generate a model representation of the tire pressure and simulate this model based on real-time performance data. The tire pressure determined by the model may be compared with the malicious performance data indicating that the tire pressure is zero, and the processing system may determine that the tire pressure is actually normal. Further, the processing system may determine that the tire pressure sensor is behaving anomalously and may generate a warning regarding the tire pressure sensor and/or take responsive action to repair the tire sensor. Alternatively, the processing system may generate a model representation of the truck and use the malicious performance data about the tire pressure data to simulate performance data for the truck (or for other components of the truck). The simulated performance data may be compared with the actual performance data. In response to determining that the actual performance data of the truck significantly deviates from the simulated data, the processing system may determine that the performance data from the tire pressure sensor is anomalous and may generate a warning regarding the tire pressure sensor and/or take responsive action to repair the tire sensor.

In yet another example, the performance data may indicate that a processing system onboard the truck has failed. In some configurations, a processing system in the laboratory environment 130 or a virtual processing system in the virtual environment 140 may be activated to replace the failed processing system onboard the truck. The replacement processing system may perform the functions of the failed processing system via network 100. For example, the performance data may indicate that a component of the truck is behaving anomalously (e.g., providing anomalous performance data, such as unusual pressure or temperature information), and, consequently, it may be determined that such component has failed and needs to be replaced.

Figure 2:
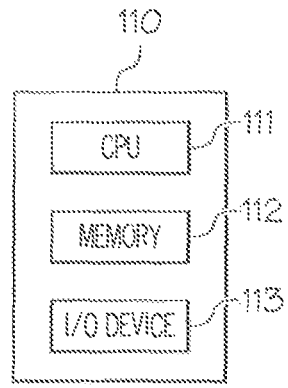
FIG. 2 is a schematic representation of a processing system configured to support multi-component and mixed-reality simulation environments.

Referring now to FIG. 2, processing system 110, which may be configured to support multi-component and mixed-reality simulation environments, now is described. Processing system 110 may comprise a central processing unit ("CPU") 111, a memory 112, and an input and output ("I/O") device 113. Memory 101 may store computer-readable instructions that may instruct processing system 110 to perform certain processes. In particular configurations, when executed by CPU 111, the computer-readable instructions stored in memory 112 may instruct CPU 111 to perform one or more of the processes disclosed herein. I/O device 113 may transmit data to/from network 100 and may transmit data to/from other devices connected to processing system 110, for example. Further, I/O device 113 may implement one or more of wireless and wired communication between processing system 110 and other devices internal to and external to system 100.

Figure 3:
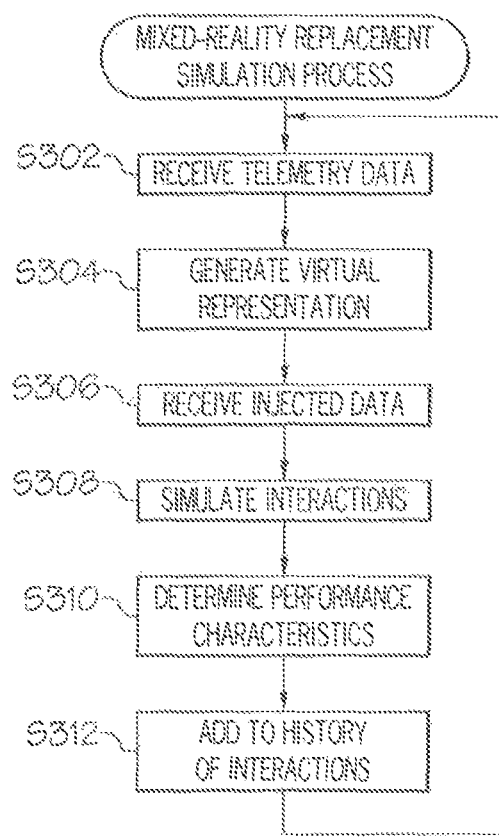
FIG. 3 illustrates a mixed-reality replacement simulation process.

Referring now to FIG. 3, a mixed-reality replacement simulation process now is described. In the mixed-reality replacement simulation process of FIG. 3, a component from laboratory environment 130, such as one or more of lab devices 131A-D, or a component from virtual environment 140, such as one or more of virtual devices 141A-D, may be injected into a model of components interacting in real-world environment 120, such as one or more of real-world devices 121A-N, to evaluate the performance of the component. This method, for example, may help researchers develop new components by modeling how such new components would operate in the real world before undergoing extensive real-world testing.

In S302, processing system 110 may receive real-time telemetry data from a plurality of real-world components, such as real-world devices 121A-N. These components may be part of one or more systems, such as a first truck comprising real-world devices 121A-G and a second truck comprising real-world devices 121H-N, for example. The telemetry data may include, for example, position data, environmental data, functional status, and a variety of other parameters. Processing system 110 may store the telemetry data in memory 112, for example.

In S304, processing system 110 may generate a virtual representation in virtual environment 140 of each of real-world devices 121A-N based on the telemetry data received in S302 and, in some configurations, one or more of a history of previously received telemetry data for real-world devices 121A-N and/or other similar devices, a history of environmental data for real-world environment 120 and/or real-time environmental data for real-world environment 120. A virtual device, such as one or more of virtual devices 141A-D, may be created as the model representation for each of the real-world devices 121A-N. In some configurations, the virtual representation may be based on statistical summary information describing such histories of interaction among these components themselves and among these components and the environment.

In S306, processing system 110 may receive lab data injected from laboratory environment 130. The lab data may include telemetry data for one or more lab components, such as one of lab devices 131A-D, which may include measurements of/by the lab component performed in the lab, simulated data for the lab components from the lab, or a combination thereof. Processing system 110 may use the lab data and, in some configurations, other data, to generate a virtual representation of the lab components in virtual environment 140 in a manner similar to that of S304. A virtual device, such as one or more of virtual devices 141A-D, may also be created as the model representation for each of the lab devices 131A-D. In some configurations, the lab data may correspond to lab components to be used in conjunction with the existing real-world components. In other configurations, the lab data may indicate that the lab data is to be used instead of the data regarding one or more real-world components. For example, this may occur when the lab data includes false-positive information indicating that one of the real-world components has failed or otherwise malfunctioned. In such configurations, the virtual representation of the real-world component to be replaced may be modified based on the injected data, such that the virtual representation behaves consistently with the injected data.

In S308, processing system 110 may simulate interactions in the real world using the model representations of real-world devices 121A-N and lab devices 131A-D in virtual environment 140. Such simulations may be performed in real-time and continuously updated based on the real-time data received from the real-world environment 120 (e.g., from real-world devices 121A-N) and from the lab environment 130 (e.g., from lab devices 131A-D). The simulations may generate predicted performance data for the devices. In configurations in which the lab data corresponds to lab components to be used in conjunction with the existing real-world components, the simulations may provide information about how the lab components would interact with existing systems, for example. In configurations in which the lab data is to be used instead of the data regarding one or more real-world components, about how the existing systems would interact with the lab component instead of the actual component, for example.

In S310, processing system 110 may determine performance characteristics of each of the virtual representations of the real-world components and the lab components based on the simulated interactions. The performance characteristics may be, for example, simulated telemetry data. These performance characteristics may be compared with the actual telemetry data received from the real-world components to determine how the lab components affected the real-world components' performance. In some configurations, statistical information (e.g., average data, range data, mode data, median data) about the simulated interactions may be determined as the performance characteristics for one or more parameters of the performance data. In other configurations, more-advanced techniques, such as anomaly detection and/or machine learning, for example, may be used to analyze the simulated interactions and to determine performance characteristics for one or more parameters of the performance data.

In S312, one or more of the simulated performance data and the performance characteristics determined therefrom for one or more of the real-world components and lab components may be added to the history of interactions stored in memory 112. Consequently, in addition to learning how real-world components interact in the real-world in real-time (e.g., based on the received telemetry data), additional data can also be obtained regarding how the same real-world components interact with the lab components under the same real-world conditions in real-time (e.g., based on the simulation). Thus, data for a plurality of scenarios may be rapidly obtained simultaneously, and model representations of components may constantly be updated therefrom.

After S312, the process may return to S302 and repeat periodically to build robust models in reduced amounts of time. In particular, as additional performance data is acquired and more interactions are simulated, the models used to simulate performance data may be refined, adapted, and/or improved over time. Moreover, because data for a plurality of scenarios may be obtained simultaneously, the amount of time used to refine, adapt, and/or improve models may be reduced.

Figure 4:
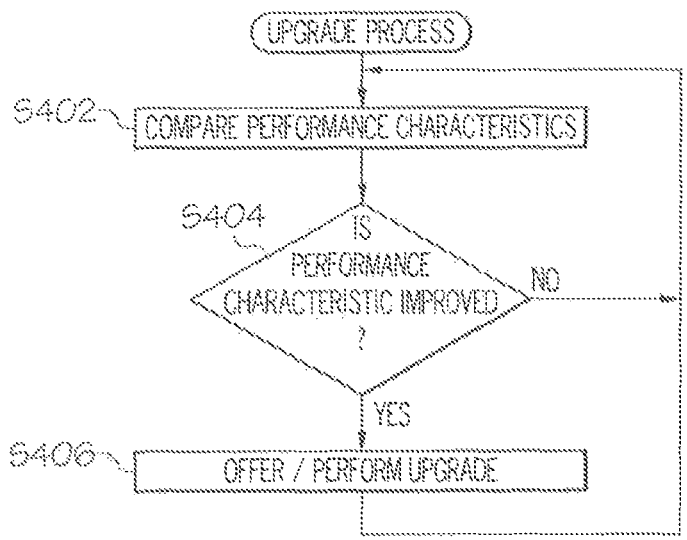
FIG. 4 illustrates an upgrade process.

Referring now to FIG. 4, an upgrade process now is described. The upgrade process of FIG. 4 may be performed after lab data for a lab component, such as a new prototype component, has been injected into a model representation and used in a simulation to determine performance characteristics for the lab component and/or performance characteristics for real-world components interacting with the lab component, such as the processes performed in S306, S308, and S310, for example.

In S402, processing system 110 may compare the performance characteristics (e.g., the performance characteristics determined in S310) of the real-world components interacting with the lab component in the simulation in S308 with the actual performance characteristics of the real-world components in the real-world environment.

In S404, processing system 110 may determine whether the simulated interactions with the lab component indicated that the presence of the lab component would improve (e.g., make the one or more components more robust, make the one or more components more responsive, make the one or more components more accurate, make the one or more components faster) the performance characteristics of one or more of the real-world components in comparison to the actual performance data (e.g., the telemetry data) about the real-world component. If the simulated interactions indicate that the presence of the lab component would not improve the performance characteristics of one or more of the real-world components in comparison to the actual performance data (S404: No), the process may return to S402 and processing system 110 may wait to compare performance characteristics determined in another instance of S310. If the simulated interactions indicate that the presence of the lab component would improve the performance characteristics of one or more of the real-world components in comparison to the actual performance data (S404: Yes), then the process may process to S406.

In S406, processing system 110 may provide the operator or owner of the system comprising the components whose performance characteristics were improved by the interaction with the lab component with an offer to upgrade the system with the lab component. In some configurations, such as systems where the lab component includes a software upgrade or other readily deployable element, processing system 110 may automatically perform the upgrade, for example, by pushing out the software upgrade to the real-world system. In certain configurations, for example, processing system 110 may inject into a scheduling system or a maintenance system a task to replace a component of the real-world with the upgraded component. In such configurations, the upgraded component may be a software upgrade, an actual physical component, or any other readily deployable element, for example. In particular configurations, the upgraded component may be a duplicate of the real-world component (or have similar characteristics to the real-world component). In such configurations, a swap-out may be scheduled to replace a real-world component with the upgraded component when processing system 110 predicts that the real-world component is likely to fail. Thereafter, the process may return to S402 and processing system 110 may wait to compare performance characteristics determined in another instance of S310.

Figure 5:
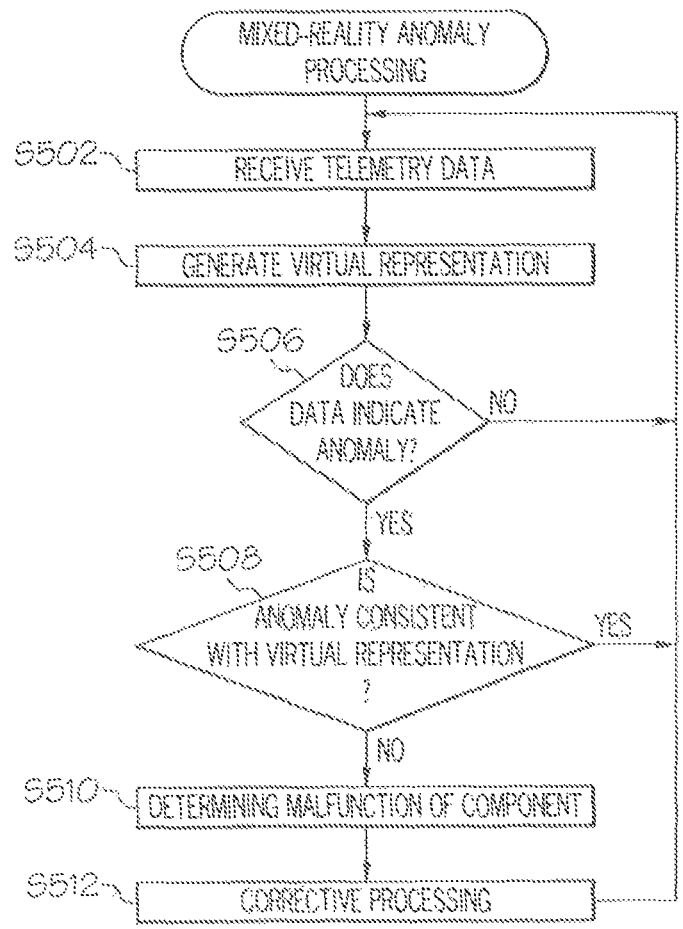
FIG. 5 illustrates a process of mixed-reality anomaly processing.

Referring now to FIG. 5, a process of mixed-reality anomaly processing now is described. The process of FIG. 5 may be used to determine, in real time, whether anomalous telemetry data received from a real-world component, such as one of components 121A-N, for example, actually corresponds to an anomalous event or whether the anomalous telemetry data is anomalous because the component is malfunctioning (e.g., broken, hacked, infected with a virus).

In S502, processing system 110 may receive real-time telemetry data from a plurality of real-world components. The telemetry data may include data for a plurality of parameters for each of the respective real-world components (e.g., location of each component, a plurality of sensor data for each component, operational status for each component). Processing system 110 may store this data in memory 112 to aggregate historical telemetry data for the real-world components.

In S504, processing system 110 may use historical data for each of the real-world components, which may be obtained from memory 112 or elsewhere, and the real-time telemetry data from each of the real-world components to generate a virtual representation of the system (e.g., a truck) that includes the real-world components. The virtual representation of the system may include a virtual representation of each of the real-world components included in the system. For example, processing system 110 may generate virtual device 141D as a virtual representation of real device 121B. Processing system 110 may generate virtual telemetry data for virtual device 141D based on the historical telemetry data for real device 121B and the real-time telemetry data received from the other real devices 121A and 121C-N. In certain configurations, processing system 110 may also use predicted future data and/or expected data to generate the virtual representation of the system. For example, processing system 110 may determine that a truck is on a particular road based on location information received from the truck and may predict that the truck is going to climb a steep hill. The effects of the steep hill on the truck may be incorporated into the virtual representation as predicted future data and/or expected data.

In S506, processing system 110 may determine whether the real-time telemetry data associated with one or more of the real-world components is anomalous or otherwise indicates an anomaly (e.g., a significant loss of pressure in a wheel, the malfunctioning of a component, a significant temperature change, a strange location, other strange, unexpected, or otherwise notable behavior). Anomalies may be predefined or may be identified based on certain characteristics, such as the level of response required to correct the anomaly, the level of the effects on the system that would be caused by the anomaly, or a variety of other factors. If processing system 110 determines that the real-time telemetry does not indicate an anomaly (S506: No), the process may return to S502 and processing system 110 may wait to receive additional real-time telemetry data. If processing system 110 determines that the real-time telemetry indicates an anomaly (S506: Yes), the process may proceed to S508.

Continuing the example in which virtual device 141D is the virtual representation of real device 121B, real device 121B may be a tire pressure sensor for a truck including real components 121A-G. A hacker may have reprogrammed real device 121B to indicate a tire pressure of zero. Thus, when processing system 110 receives the telemetry data from real device 121B, processing system 110 may determine that the telemetry data indicates an anomaly (e.g., a flat tire) (S506: Yes).

In S508, processing system 110 may determine whether the anomaly is consistent with the virtual representations determined in S504. In particular, processing system 110 may determine whether the received telemetry value for a real component sufficiently matches the telemetry value generated for the virtual representation of the real component. For example, the virtual representation may identify a range of values for the telemetry data for the real component, such as a confidence interval or values determined using different models or assumptions. If the actual telemetry data for the real component is within that range, for example, processing system 110 may determine that the received telemetry value for the real component sufficiently matches the telemetry value generated for the virtual representation of the real component and, thus, that the actual telemetry data is consistent with the virtual representation. If the actual telemetry data for the real component is not within that range, for example, processing system 110 may determine that the received telemetry value for the real component does not sufficiently match the telemetry value generated for the virtual representation of the real component and, thus, that the actual telemetry data is not consistent with the virtual representation.

If processing system 110 determines that the actual telemetry data from the real components is consistent with the virtual representations of the real components (S508: Yes), processing system 110 may determine that the telemetry data is accurate and return to S502 where processing system 110 may wait to receive additional real-time telemetry data. In some configurations, processing system 110 may provide a warning related to the anomaly indicated by the anomalous telemetry data prior to returning to S502.

If processing system 110 determines that the actual telemetry data from a real component is not consistent with the virtual representation of the component (S508: No), processing system 110 may determine that the telemetry data is not accurate and the process may proceed to S510. In S510, processing system 110 may determine that the real component is malfunctioning (e.g., hacked, broken, calibrated improperly, infected).

Continuing the example with virtual device 141D and real device 121B, virtual device 141D may be determined to have a tire pressure of 70 psi with a 99% confidence interval of ±10 psi in S504. Thus, in a configuration where the 99% confidence interval is the criteria for consistency, processing system 110 may determine that the telemetry data received from real device 121B is not consistent with the telemetry data generated in the virtual representation of real device 121B (e.g., virtual device 141D), and processing system 110 may determine that real device 121B is malfunctioning, as described below.

In response to determining that a real component is malfunctioning, processing system 110 may proceed to S512. In S512, processing system 110 may perform corrective processing (described below in more detail). After performing corrective processing, the process may return to S502 and processing system 110 may wait to receive additional real-time telemetry data.

Accordingly, the processes of FIG. 5 may permit processing system 110 to validate anomalous telemetry data in real time by determining whether the telemetry data indicates a real anomaly or whether the device providing the telemetry data is malfunctioning. Consequently, this may ultimately prevent processing system 110 from wasting resources by collecting inaccurate telemetry data and may prevent other real components from wasting resources by acting upon inaccurate telemetry data.

Figure 6A:
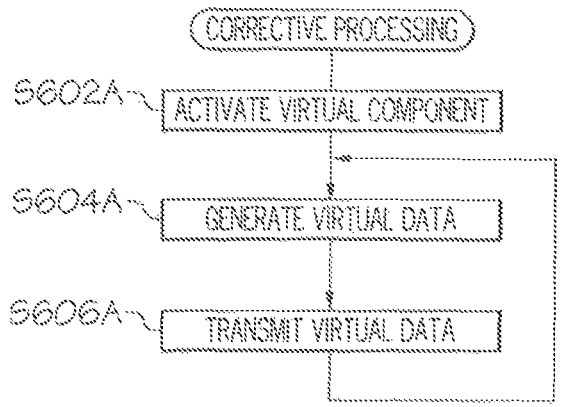
FIG. 6A illustrates a first process of corrective processing.
Figure 6B:
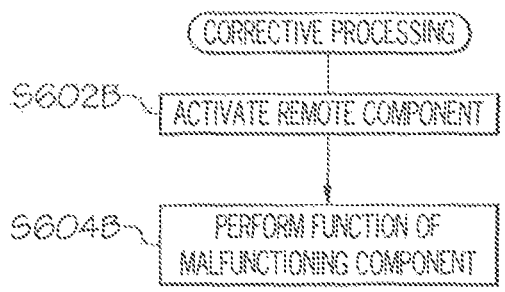
FIG. 6B illustrates a second process of corrective processing.
Figure 6C:
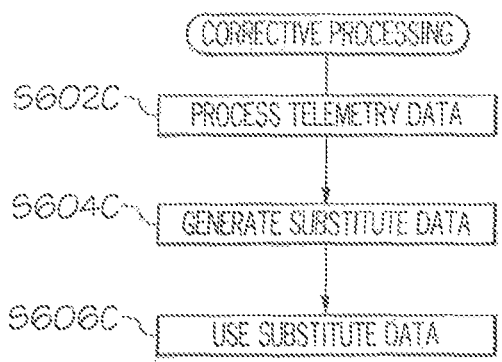
FIG. 6C illustrates a third process of corrective processing.

FIGS. 6A-C below show particular example processes of performing corrective processing in accordance with S512. Nevertheless, corrective processing may be performed in a variety of different manners and should not be limited to the example processes of FIGS. 6A-C.

Referring now to FIG. 6A, a first process of corrective processing now is described. In the first process of corrective processing, a virtual component may be used to replace the malfunctioning real component. The virtual component may be an algorithm or model that performs functions similar to the malfunctioning component or that generates telemetry data similar to the malfunctioning component. For example, virtual device 141D may be used as a replacement for real device 121B since the model used to generate telemetry for virtual device 141D models the functionality of real device 121B.

In S602A, processing system 110 may activate a virtual component, such as one or more of virtual devices 141A-D, to replace the malfunctioning real component. Processing system 110 may also command the malfunctioning real component to deactivate or to stop transmitting data in some configurations. In other configurations, processing system 110 may command the other real components to stop accepting telemetry data from the malfunctioning real component (e.g., to blacklist the malfunctioning real component). In certain configurations, processing system 110 may perform processing associated with the activated virtual component. In some configurations, another processing system may perform processing associated with the activated virtual component.

In S604A, the activated virtual component may generate virtual telemetry data to replace the telemetry data from the malfunctioning real component. The virtual component may generate the virtual telemetry data based on telemetry data received from other real components, environmental data, historical telemetry and environmental data. The virtual component may use the same model as the virtual representation of the malfunctioning real component (e.g., the virtual component may be virtual device 141D) or may use another model or other parameters. In some configurations, the virtual component may need to collect additional information from the system including the remaining real components, for example.

In S606A, the virtual component may transmit the generated virtual telemetry data to the other real components of the system including the malfunctioning components, other real components designated to receive such information, lab components designated to receive such information, and processing system 110 if processing system 110 has not yet received the data. Thereafter, the process may return to S604A and generate new virtual telemetry data for transmission. This process may be repeated until the malfunctioning component is repaired, for example.

Referring now to FIG. 6B, a second process of corrective processing now is described. In the second process of corrective processing, a remote component may be used to replace the malfunctioning real component. For example, the remote component may be a lab component that performs functions similar to the malfunctioning component or that generates telemetry data similar to the malfunctioning component. As an example, lab device 131A may be used as a replacement for real device 121A. The remote component may alternatively be another real component, such as a backup component deployed with the system including the malfunctioning device.

In S602B, processing system 110 may activate the remote component, such as one or more of lab devices 131A-D, to replace the malfunctioning real component. Processing system 110 may also command the malfunctioning real component to deactivate or to stop transmitting data in some configurations. In other configurations, processing system 110 may command the other real components to stop accepting telemetry data from the malfunctioning real component (e.g., to blacklist the malfunctioning real component). In certain configurations, processing system 110 may perform processing associated with the activated virtual component. In some configurations, another processing system may perform processing associated with the activated virtual component.

In S604B, the activated remote component may generate telemetry data to replace the telemetry data from the malfunctioning real component. If the activated remote component is in the real-world environment 120, for example, the remote component may begin performing its functions, communicating with the other real components, and generating telemetry data and performing functions to replace the malfunctioning component. If the activated remote component is in the lab, the telemetry data from the real components may be transmitted to the lab component. Further, stimuli designed to match the environment of the malfunctioning component may be replicated in the lab, such that the lab component acts as if it were in the field. Therefore, based on the stimuli in the lab and the telemetry data received from the real components, the lab component may generate telemetry data to replace the malfunctioning component and replace the other functions of the malfunctioning component.

Referring now to FIG. 6C, a third process of corrective processing now is described. The third process of corrective process may be similar to the first process of corrective processing. In the third process of corrective processing, processing system 110 may use the telemetry data from real components other than the malfunctioning component to generate substitute telemetry data to substitute for the telemetry data of the malfunctioning component. Processing system 110 may command the malfunctioning real component to deactivate or to stop transmitting data in some configurations. In other configurations, processing system 110 may command the other real components to stop accepting telemetry data from the malfunctioning real component (e.g., to blacklist the malfunctioning real component).

In S602C, processing system 110 may process the telemetry data received from other real components and determine parameters of the telemetry data that may be used to derive the substitute telemetry data. For example, where the malfunctioning component is a tire pressure sensor, processing system 110 may identify telemetry data for camber and pitch of the tire previously monitored by the malfunctioning component. Processing system 110 may begin processing (e.g., formatting, normalizing) this data for inclusion in a data-generating process.

In S604C, processing system 110 may generate the substitute telemetry data from the data processed in S602C. For example, processing system 110 may use the camber and pitch data to generate substitute data for tire pressure.

In S606C, processing system 110 may transmit the substitute data to the other real components. In some configurations, processing system 110 also may use the substitute information when determining virtual representations of the other real components, as well as when determining a virtual representation of the malfunctioning component.

In particular configurations, corrective processing other than those described above with respect to FIGS. 6A-C may be implemented. For example, when processing system 110 determines that a component is malfunctioning or predicts that a component will malfunction, processing system 110 may initiate a corrective process to correct the malfunction in the field. In some configurations, processing system 110 may replace the component with a similar component (e.g., a redundant component, a component configured to perform similar functions). In other configurations, processing system 110 may correct the malfunction by controlling the component. For example, if processing system 110 determines that a truck's tire pressure will increase to unsafe levels due to upcoming road and/or weather conditions, processing system 110 may take corrective action to prevent a malfunction by remotely controlling a valve to release pressure from the truck's tire(s) before the truck is exposed to the upcoming road and/or weather conditions.

Figure 7:
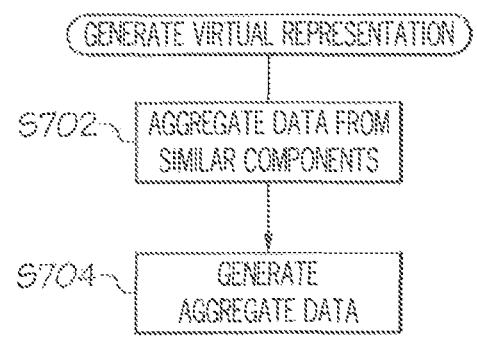
FIG. 7 illustrates a process of generating a virtual representation.

Referring now to FIG. 7, a process of generating a virtual representation now is described. The process of FIG. 7 is a process of aggregating telemetry data received from a plurality of components having similar features, functions, or both and generating statistics based on the aggregated telemetry data for each group of similar components. The aggregated telemetry data may be received from components from the real-world environment 120, the laboratory environment 130, the virtual-world environment 140, or combinations of components from a plurality of these environments. For ease of explanation, only telemetry data from real components is described below, however, the telemetry data could be from lab components or virtual components as well.

In S702, processing system 110 may identify real components with similar features and aggregate the telemetry data received from the components with similar features. For example, processing system 110 may determine that components that perform similar functions, such as all tire pressure sensors, are similar components. For example, processing system 110 may receive telemetry data from a first group of trucks operated by a first delivery service. Processing system 110 also may receive telemetry data from a second group of trucks operated by a second delivery service. Each of these trucks may have a tire pressure sensor that generates telemetry data with parameters, such as tire pressure and location, for example. Processing system 110 may aggregate the telemetry data from the tire pressure sensors for the trucks from both the first group of trucks and the second group of trucks.

In S704, processing system 110 may use the aggregated telemetry data for each group of similar components to generate aggregate statistical data for the respective group of similar components. Returning to the example of aggregated tire pressure sensors, processing system 110 may use the aggregated telemetry data from the tire pressure sensors for the trucks from both the first group of trucks and the second group of trucks to determine the average distance travelled by a truck before a truck tire goes flat, as well as a standard deviation for such average. The statistical data may include ranges, medians, means, modes, standard deviations, and other statistical information, for example. In some configurations, the aggregate statistical data may include virtual models of the similar components and their interactions with the real-world environment 120 and real components therein. In particular configurations, metadata may be removed from the aggregated telemetry data and the aggregate statistical data. In some configurations, analytical techniques other than statistical methods may be used to generate aggregate data about the components or systems including such components.

Figure 8:
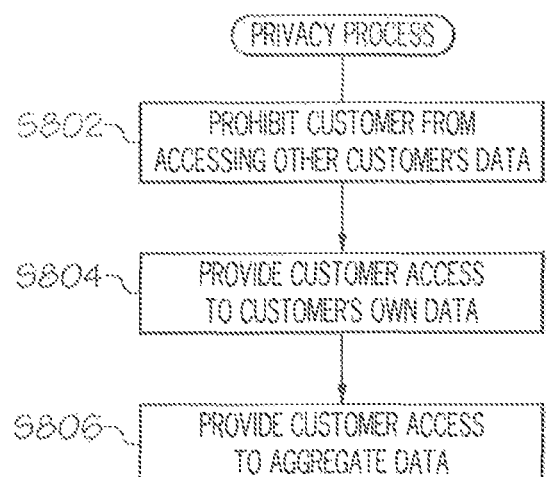
FIG. 8 illustrates a privacy process.

Referring now to FIG. 8, a privacy process now is described. The privacy process of FIG. 8 allows an information aggregator to provide the aggregate statistical information determined in the process of FIG. 7 while maintaining the privacy of the telemetry data from which the aggregate statistical information is derived. For example, the first delivery service and the second delivery service may operate in similar manners and have a need for similar information about their respective fleets of trucks. Nevertheless, they may be competitors and may not wish to share raw telemetry for business reasons. Accordingly, a third-party administering processing system 110 may perform the process of FIG. 7 to produce data that may be more accurate (because it is based on the data from both companies) and that does not provide confidential data that is protected for business purposes.

In S802, processing system 110 may segment the telemetry data from each customers' components, such that customers are prohibited from accessing other customers' raw telemetry data. Continuing the example of the first delivery service and the second delivery service, processing system 110 may prevent the first delivery service from accessing the telemetry data received from the second group of trucks operated by the second delivery service. Similarly, processing system 110 may prevent the second delivery service from accessing the telemetry data received from the first group of trucks operated by the first delivery service.

In S804, processing system 110 may allow each customer to access that customers' own raw telemetry data. Again continuing the example of the first delivery service and the second delivery service, processing system 110 may provide the first delivery service with access to the telemetry data received from the first group of trucks operated by the first delivery service. Similarly, processing system 110 may provide the second delivery service with access to the telemetry data received from the second group of trucks operated by the second delivery service.

In S806, processing system 110 may allow each customer to access that aggregated statistical information determined in S704 of FIG. 7. Further continuing the example of the first delivery service and the second delivery service, processing system 110 may provide both the first delivery service and the second delivery service access to the information indicating the average distance travelled by a truck before a truck tire goes flat and a standard deviation for such average. Moreover, if models are included in the aggregated statistical information, processing system 110 may allow each customer to access these models as well, in some configurations. Consequently, all customers may benefit by receiving aggregated statistical information, which may be more accurate and may better model actual conditions in the real-world environment 120. In some configurations, techniques to perturb the aggregate data or otherwise obfuscate such data may also be utilized to preserve the privacy of component-level data and to make it more difficult to back-calculate data for other customers' components.

The terminology used herein is for the purpose of describing particular aspects only and is not intended to be limiting of the disclosure. As used herein, the singular forms "a," "an," and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of means or step plus function elements in the claims below are intended to comprise any disclosed structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. For example, this disclosure comprises possible combinations of the various elements and features disclosed herein, and the particular elements and features presented in the claims and disclosed above may be combined with each other in other ways within the scope of the application, such that the application should be recognized as also directed to other embodiments comprising other possible combinations. The aspects of the disclosure herein were chosen and described in order to best explain the principles of the disclosure and the practical application and to enable others of ordinary skill in the art to understand the disclosure with various modifications as are suited to the particular use contemplated.

What is claimed is:

1. A method comprising:
receiving real-time data about a real component operating in a real-world environment;
generating a virtual representation of the real component based on the real-time data about the real component and historical data associated with the real component;
receiving injected data from a lab, the injected data providing data about a lab component operating in the lab;
wherein the lab component comprises a physical device and the lab comprises a laboratory environment that subjects the physical device to controlled interactions with the physical device;
generating a virtual representation of the lab component using the injected data;
combining three domains in order to collectively monitor the real component, the lab component, the virtual representation of the real component and the virtual representation of the lab component;
the three domains including the real-world environment, the laboratory environment, and a virtual environment;
wherein combining the three domains includes simulating, in the virtual environment, a real-time interaction between the virtual representation of the real component and the virtual representation of the lab component;
continuously updating the real-time interaction between the virtual representation of the real component and the virtual representation of the lab component based upon real-time environmental data regarding the real-world environment and real-time environmental data regarding the lab; and
determining a real-time performance characteristic of at least one of the lab component and the real component based on the simulated real-time interaction in the real-world environment.

2. The method of claim 1, further comprising:
receiving real-time data about another real component operating in the real-world environment, the other real component being different from the real component,
using the injected data as a substitute for the real-time data about the other real component in the process of simulating the real-time interaction in the real-world environment between the real component and the lab component, and
wherein determining the real-time performance characteristic of the at least one of the lab component and the real component comprises determining the real-time performance characteristic of the lab component relative to a real-time performance characteristic of the other real component determined from the real-time data about the other real component.

3. The method of claim 2, further comprising:
determining whether the real-time performance characteristic of the lab component is improved relative to the real-time performance characteristic of the other real component; and
in response to determining that the real-time performance characteristic of the lab component is improved relative to the real-time performance characteristic of the other real component, transmitting a notification to an operator of the other real component in the real-world environment, the notification notifying the operator of an available upgrade incorporating features of the lab component.

4. The method of claim 1,
wherein the lab component is used as a substitute for another real component interacting with the real component in the real-world environment,
wherein the injected data simulates a malfunction of the other real world component,
wherein determining the real-time performance characteristic of the at least one of the lab component and the real component comprises determining the real-time performance characteristic of the real component, and
wherein the method further comprises modifying the virtual representation of the real component to establish the real-time performance characteristic of the real component determined when the injected data simulates the malfunction of the other real world component as a predicted response of the real component to the malfunction of the other real world component.

5. The method of claim 1, wherein the real component comprises a first component of a vehicle under evaluation and the lab component is a second component of the vehicle that is used with the real component.

6. The method of claim 1, further comprising:
determining a predicted performance characteristic of the at least one of the lab component and the real component based on the simulated real-time interaction in the real-world environment and expected future data about the real component operating in the real-world environment.

7. The method of claim 1, wherein the historical data associated with the one or more real components comprises:
information describing a history of interaction between a plurality of components similar to the real component and the real-world environment; and
information describing a history of interaction between the real component and the real-world environment.

8. A system comprising:
a processing system configured to:
receive real-time data about a real component operating in a real-world environment;
generate a virtual representation of the real component based on the real-time data about the real component and historical data associated with the real component;
receive injected data from a lab, the injected data providing data about a lab component operating in the lab;
wherein the lab component comprises a physical device and the lab comprises a laboratory environment that subjects the physical device to controlled interactions with the physical device;
generate a virtual representation of the lab component using the injected data;
combine three domains in order to collectively monitor the real component, the lab component, the virtual representation of the real component and the virtual representation of the lab component;
the three domains including the real-world environment, the laboratory environment, and a virtual environment;
wherein combine three domains includes simulate, in the virtual environment, a real-time interaction between the virtual representation of the real component and the virtual representation of the lab component;

continuously update the real-time interaction between the virtual representation of the real component and the virtual representation of the lab component based upon real-time environmental data regarding the real-world environment and real-time environmental data regarding the lab; and determine a real-time performance characteristic of at least one of the lab component and the real component based on the simulated real-time interaction in the real-world environment.

9. The system according to claim 8,
wherein the processing system is further configured to receive real-time data about another real component operating in the real-world environment, the other real component being different from the real component,
wherein, when the processing system simulates the real-time interaction in the real-world environment between the real component and the lab component, the processing system is configured to use the injected data as a substitute for the real-time data about the other real component, and
wherein, when determining the real-time performance characteristic of the at least one of the lab component and the real component, the processing system is configured to determine the real-time performance characteristic of the lab component relative to a real-time performance characteristic of the other real component determined from the real-time data about the other real component.

10. The system according to claim 9,
wherein the processing system is further configured to:
determining whether the real-time performance characteristic of the lab component is improved relative to the real-time performance characteristic of the other real component; and
in response to determining that the real-time performance characteristic of the lab component is improved relative to the real-time performance characteristic of the other real component, transmit a notification to an operator of the other real component in the real-world environment, the notification notifying the operator of an available upgrade incorporating features of the lab component.

11. The system according to claim 8,
wherein, when simulating the real-time interaction in the real-world environment between the real component and the lab component, the processing system is configured to use the lab component as a substitute for another real component interacting with the real component in the real-world environment,
wherein the injected data simulates a malfunction of the other real world component,
wherein, when determining the real-time performance characteristic of the at least one of the lab component and the real component, the processing system is configured to determine the real-time performance characteristic of the real component, and
wherein the processing system is further configured to modify the virtual representation of the real component to establish the real-time performance characteristic of the real component determined when the injected data simulates the malfunction of the other real world component as a predicted response of the real component to the malfunction of the other real world component.

12. The system according to claim 8, wherein the real component comprises a first component of a vehicle under evaluation and the lab component is a second component of the vehicle that is used with the real component.

13. The system according to claim 8, wherein the processing system is further configured to determine a predicted performance characteristic of the at least one of the lab component and the real component based on the simulated real-time interaction in the real-world environment and expected future data about the real component operating in the real-world environment.

14. The system according to claim 8, wherein the historical data associated with the one or more real components comprises:
information describing a history of interaction between a plurality of components similar to the real component and the real-world environment; and
information describing a history of interaction between the real component and the real-world environment.

15. A computer program product comprising:
a non-transitory computer readable storage medium having computer readable program code embodied therewith, the computer readable program code comprising:
computer readable program code configured to receive real-time data about a real component operating in a real-world environment;
computer readable program code configured to generate a virtual representation of the real component based on the real-time data about the real component and historical data associated with the real component;
computer readable program code configured to receive injected data from a lab, the injected data providing data about a lab component operating in the lab;
wherein the lab component comprises a physical device and the lab comprises a laboratory environment that subjects the physical device to controlled interactions with the physical device;
computer readable program code configured to generate a virtual representation of the lab component using the injected data;
computer readable program code configured to combine three domains in order to collectively monitor the real component, the lab component, the virtual representation of the real component and the virtual representation of the lab component;
the three domains including the real-world environment, the laboratory environment, and a virtual environment;
wherein computer readable program code configured to combine three domains includes computer readable program code configured to simulate, in a virtual environment, a real-time interaction the virtual representation of the real component and the virtual representation of the lab component;
computer readable program code configured to continuously update the real-time interaction between the virtual representation of the real component and the virtual representation of the lab component based upon real-time environmental data regarding the real-world environment and real-time environmental data regarding the lab; and
computer readable program code configured to determine a real-time performance characteristic of at least one of the lab component and the real component based on the simulated real-time interaction in the real-world environment.

16. The computer program product of claim 15, further comprising:

computer readable program code configured to receive real-time data about another real component operating in the real-world environment, the other real component being different from the real component, computer readable program code configured to use the injected data as a substitute for the real-time data about the other real component, and wherein the computer readable program code configured to determine the real-time performance characteristic of the at least one of the lab component and the real component comprises:

computer readable program code configured to determine the real-time performance characteristic of the lab component relative to a real-time performance characteristic of the other real component determined from the real-time data about the other real component.

17. The computer program product of claim 16, further comprising:

computer readable program code configured to determine whether the real-time performance characteristic of the lab component is improved relative to the real-time performance characteristic of the other real component; and computer readable program code configured to, in response to determining that the real-time performance characteristic of the lab component is improved relative to the real-time performance characteristic of the other real component, transmit a notification to an operator of the other real component in the real-world environment, the notification notifying the operator of an available upgrade incorporating features of the lab component.

18. The computer program product of claim 15, the computer readable program code configured to simulate the real-time interaction in the real-world environment between the real component and the lab component comprises:

computer readable program code configured to use the lab component as a substitute for another real component interacting with the real component in the real-world environment, wherein the injected data simulates a malfunction of the other real world component, wherein the computer readable program code configured to determine the real-time performance characteristic of the at least one of the lab component and the real component comprises:

computer readable program code configured to determine the real-time performance characteristic of the real component, and wherein the computer program product further comprises:

computer readable program code configured to modify the virtual representation of the real component to establish the real-time performance characteristic of the real component determined when the injected data simulates the malfunction of the other real world component as a predicted response of the real component to the malfunction of the other real world component.

19. The computer program product of claim 15, further comprising:

computer readable program code configured to determine a predicted performance characteristic of the at least one of the lab component and the real component based on the simulated real-time interaction in the real-world environment and expected future data about the real component operating in the real-world environment.

20. The computer program product of claim 15, wherein the historical data associated with the one or more real components comprises:

information describing a history of interaction between a plurality of components similar to the real component and the real-world environment; and information describing a history of interaction between the real component and the real-world environment.

* * * * *